United States Patent [19]

Byatt et al.

[11] Patent Number: 5,401,984
[45] Date of Patent: Mar. 28, 1995

[54] SEMICONDUCTOR COMPONENT FOR TRANSIENT VOLTAGE LIMITING

[75] Inventors: Stephen W. Byatt; Michael J. Maytum, both of Bedford, England

[73] Assignee: Texas Instruments Incorporated, Dallas, Tex.

[21] Appl. No.: 162,083
[22] PCT Filed: Jun. 11, 1992
[86] PCT No.: PCT/GB92/01056
§ 371 Date: Dec. 10, 1993
§ 102(e) Date: Dec. 10, 1993
[87] PCT Pub. No.: WO92/22927
PCT Pub. Date: Dec. 23, 1992

[30] Foreign Application Priority Data

Jun. 11, 1991 [GB] United Kingdom ............ 9112484

[51] Int. Cl.6 .................. H01L 29/74; H01L 29/86
[52] U.S. Cl. .................. 257/107; 257/173; 257/175; 257/499; 361/56; 361/91; 327/310
[58] Field of Search .......... 257/107, 173, 175, 499; 361/56, 91; 307/252

[56] References Cited

U.S. PATENT DOCUMENTS 4,282,555 8/1981 Svedberg ........................ 361/56

Primary Examiner—Mark V. Prenty
Attorney, Agent, or Firm—Russell E. Baumann; Richard L. Donaldson; René E. Grossman

[57] ABSTRACT

A semiconductor component for limiting transient voltages on the signal or other supply lines of a system, includes, in a common semiconductor body, a plurality of multi-junction diodes connected in the same sense between a common terminal and respective input means which are for connection to the respective supply lines of the system, and a respective further diode connected in shunt with each multi-junction diode with the opposite sense to the multi-junction diode.

14 Claims, 8 Drawing Sheets

SEMICONDUCTOR COMPONENT FOR TRANSIENT VOLTAGE LIMITING

The present invention relates to a semiconductor component for limiting transient voltages on supply lines.

The semiconductor component is especially suitable for protecting telephone system components from transient disturbances which would appear on the signal lines of the telephone system.

Past telephone systems used electromechanical components which could withstand high transient voltages which occur on signal lines as a result of natural electrical disturbances such as lightning strikes, for example. The components used in modern telephone systems consist mainly of semiconductor devices which are vulnerable to the high transient voltages which occur in telephone systems, so there is a requirement for a protective device, or protective devices, for telephone system components.

Semiconductor devices have also replaced more robust devices in other situations where they may be subjected to, and need to be protected from, high transient voltages, so there is a requirement for a protective device, or protective devices, for semiconductor devices in systems other than telephone systems.

It is an object of the present invention to provide a semiconductor component, which, when connected to the signal or other lines of a system, is capable of limiting transient voltages induced in those lines.

In accordance with the present invention, a semiconductor component, suitable for limiting transient voltages on the supply lines of a system having at least three supply lines, includes at least three input means for connection to respective ones of the supply lines, and, for each input means, a respective multi-junction diode which has a threshold voltage at which it changes from a high-impedance state to a low-impedance state, each multi-junction diode being connected in the same sense between a respective input means and a common terminal, and each multi-junction diode being paired with a respective further diode connected in shunt with it and in the opposite sense to it and one pair of the diodes having current capacities substantially equal to the combined current capacities of the other pairs of diodes.

The form of the semiconductor component having three input means is especially suitable for use in a telephone system.

Preferably, the cathode electrodes of the multi-junction diodes are connected to respective input means.

In a first form of the semiconductor component, each of the further diodes is a multi-junction diode.

In a second form of the semiconductor component, each of the further diodes is a diode having a single PN junction.

In a further form of the semiconductor component, at least one, but not all, of the further diodes is a multi-junction diode, and each of the other further diodes has a single PN junction.

Preferably, the semiconductor component has the form of a semiconductor body having two substantially parallel major surfaces, wherein the electrodes of the diodes lie on the major surfaces, the input means are a plurality of electrical conductors which make contact, on one of the major surfaces, with the electrodes of respective pairs of diodes, a further electrical conductor which is the common terminal makes contact on the other of the major surfaces with all of the electrodes at that surface, and the other pairs of diodes are symmetrically positioned in relation to the pair of diodes having current capacities substantially equal to the combined current capacities of the other pairs of diodes.

Preferably, the diodes are alternately a multi-junction diode and a further diode, both along and across the major surface, and each input means contacts a diode pair comprising a multi-junction diode and a further diode, and, preferably, each input means extends across a part of the major surface.

In one arrangement for the semiconductor component, each of the further diodes is a multi-junction diode and an isolation region isolates each diode pair electrically from the other multi-junction diode pairs which occupy the same semiconductor body.

In an alternative arrangement for the semiconductor component, each of the further diodes has a single PN junction and a doped region of the semiconductor body is common to all the diode pairs.

In an especially fast-acting alternative arrangement for the semiconductor component, the multi-junction diodes are grouped around the middle of the semiconductor body, and a doped region of the semiconductor body is common to all the diode pairs.

Preferably, each multi-junction diode includes a cathode ($n+$) region which has a plurality of gaps which are filled by the material of the adjacent p-type gate region.

The penetration of the cathode region by the adjacent p-type region results in the cathode-gate junction being shunted by a part of the p-type gate region. That arrangement increases the current required to maintain the component in a conductive state compared with a component with an uninterrupted cathode region, and the designer of the component is able to set the holding current by the layout of the penetrated cathode region.

In the second form of the semiconductor component, each multi-junction diode can have a substantially PNPN structure with a lightly doped n-type ($n^-$) inner N region, each further diode can have a heavily doped n-type ($n+$) region, a lightly doped n-type ($n^-$) region adjacent to the $n+$ region, and a p-type region adjacent to the $n+$ region, and the n-type inner N region of the multi-junction diode can be thicker than the $n+$ region of the further diode, where thickness is measured in the direction of current flow through the semiconductor component.

Preferably, each multi-junction diode has a substantially PNPN structure, and includes, in the inner N region which is a lightly doped n-type ($n^-$) region, a buried n-type region of greater impurity concentration than the $n^-$-region, wherein the buried n-type region is adjacent to the inner P region of the PNPN structure.

The second form of the semiconductor component in the form of a semiconductor body is so structured that, when one of the first pair of diodes conducts, its electrical charge is free to flow to and initiate conduction of at least one of another pair of diodes.

Advantageously, the multi-junction diodes are grouped around the middle of the semiconductor body and, advantageously, the multi-junction diodes are so structured as to conduct charge more readily near the middle of the semiconductor body than elsewhere in the semiconductor body.

In a modified structure for the second form of the semiconductor component, each multi-junction diode is so structured as to operate as a first multi-junction diode near the middle of the semiconductor body and as a second multi-junction diode elsewhere in the semiconductor body, the first multi-junction diode being smaller and more sensitive than the second multi-junction diode.

In the following description, the preferred form of the multi-junction diode is referred to as a bulk breakdown diode. One form of bulk breakdown diode is described in UK patent No. GB 2 113 907B.

Examples of semiconductor components for limiting transient voltages, in accordance with the invention, will now be described, by way of example only, with reference to the accompanying drawings, in which:

FIG. 1 is a sectional perspective view of an integrated circuit arrangement of a first form of a semiconductor component, for limiting transient voltage changes, suitable for telephone system protection, FIG. 2 is a sectional perspective view of an integrated circuit arrangement of a second form of a semiconductor component, for limiting transient voltage changes, suitable for telephone system protection, FIG. 3 is a circuit diagram representation of the first form of the semiconductor component showing the device as a plurality of bulk breakdown diodes, FIG. 4 is a circuit diagram representation of the second form of the semiconductor component showing the component as a plurality of bulk breakdown diodes and rectifier diodes, FIG. 5 is a circuit diagram representation of either form of the semiconductor component showing the component as a plurality of blocks, FIG. 6 is a simplified structural representation of a single bulk breakdown diode, FIG. 7 is a development of the simplified structural representation of the single bulk breakdown diode, FIG. 8 is a circuit diagram representation of the single bulk breakdown diode, derived from FIG. 7, FIG. 9 is a symbol representing the single bulk breakdown diode, FIG. 10 is a simplified structural representation of a combined bulk breakdown diode and reverse-connected rectifier diode, FIG. 11 is a symbolic representation of the structure of FIG. 10, FIG. 12 is a representation of the current-voltage characteristic of the component represented by FIG. 10, FIG. 13 is a representation of the current-voltage characteristic of a pair of bulk breakdown diodes, which operate as devices connected in shunt with each other with opposing polarities, FIG. 14 is a plan view of a monolithic integrated circuit form of a combined bulk breakdown diode and reverse-connected rectifier diode, FIG. 15 is a sectional view of the monolithic integrated circuit shown in FIG. 14 taken along the line XX, FIG. 16 is a plan view of a monolithic integrated circuit form of a bidirectional bulk breakdown diode, FIG. 17 is a sectional view of the monolithic integrated circuit shown in FIG. 16 taken along the line XX, FIG. 18 is a plan view of an alternative integrated circuit arrangement of the second form of the semiconductor component and, FIG. 19 is a sectional view of the monolithic integrated circuit shown in FIG. 18 taken along the line YY.

Referring to FIG. 1 of the accompanying drawings, the first form of a semiconductor component for limiting transient voltage changes includes a first pair of bulk breakdown diodes 1, a second pair of bulk breakdown diodes 2, and a third pair of bulk breakdown diodes 3, which three pairs of bulk breakdown diodes 1,2, and 3, belong to a monolithic integrated circuit 4, and, which, in the monolithic integrated circuit 4, are isolated from one another by a continuous barrier 5. The barrier 5 forms the sides of the integrated circuit 4 in addition to extending between the bulk breakdown diodes 1, 2, and 3.

Referring to FIG. 1, the first pair of bulk breakdown diodes 1 includes a first layer 10 of p-type semiconductor material and a second layer 11 of n$^-$-type semiconductor material in contact with the first layer 10. A p-type region 13 lies in the second layer 11 and has a common surface with the second layer 11. There is an n-type region 12 below the p-type region 13, in contact with the p-type region 13 and an n$^+$-type region 14 in the p-type region 13. The n$^+$-type region 14 has a common surface with the second layer 11 and with the p-type region 13. The n$^+$-type region 14 is penetrated at a plurality of regularly spaced locations by the p-type region 13. An n$^+$-type ring 15 in the second layer 11 has a common surface with the second layer 11.

Referring to FIG. 1, the n$^+$-type region 14 occupies substantially half the length of the p-type region 13 and almost, but not quite, the full width of that p-type region. The boundary of the n-type region 12 is substantially in alignment with that of the n$^+$-type region 14.

Included in the first pair of bulk breakdown diodes 1, but not shown in FIG. 1, are a further n-type region, which lies in contact with the p-type region 10 and in the n$^-$-type region 11, and a further n$^+$-type region, which lies within the p-type region 10 and has a surface common with the lower surface (as seen in FIG. 1) of the p-type region 10. The further regions occupy the lower rear (as seen in FIG. 1) of the structure of the first pair of bulk breakdown diodes 1.

FIG. 17 is a sectional view of the structure of a pair of bulk breakdown diodes, such as the pair of bulk breakdown diodes 1 of FIG. 1, taken along a line from front to rear (as viewed in FIG. 1), where the n-type region 16, shown in FIG. 17, is the further n-type region described above, and the n$^+$-type region 17 is the further n$^+$-type region described above.

The pair of bulk breakdown diodes represented by FIG. 17 includes electrical contacts 19 and 110 on the top and bottom (as viewed in FIG. 16), respectively, whereas FIG. 1 does not include the electrical contacts for the device.

Referring to FIG. 17, the penetration of the n$^+$-type region 14 by the adjacent p-type region 13 results in the n$^+$-type region 14 being shunted by those parts of the p-type region 13 which penetrate it. The shunting effect of the p-type region 13 is used to set, for the bulk breakdown diode, the current at which it changes its impedance state, that current being called its holding current. The bulk breakdown diode has a low impedance when conducting currents higher than its holding current and switches to a high impedance state should its current fall below the holding current. The facility for setting the holding current of the bulk breakdown diode is used to ensure that the bulk breakdown diode switches to its high impedance state at a current which is above the short-circuit current for the system to which it is connected, allowing a return to the normal operation of the system once the transient voltage has passed. The holding current of the bulk breakdown diode is smallest when there is no penetration of the n+-type region 14 by the p-type region 13, and increases with the proportion of the n+-type region which is penetrated. The bulk breakdown diode which includes the regions 10, 11, 12, 13 and 14 performs as a "crowbar" switch, as described above, with its p-type region 10 positive with respect to its n+-type region 14. Without the n-type region 12, the diode would have an intrinsic breakdown voltage set by the n−-type region 11, and the ion-implanted n-region 12 sets a breakdown voltage lower than the intrinsic breakdown voltage. The addition of the ion-implanted n-region 12 permits accurate setting of the bulk breakdown diode triggering (or "crowbar") voltage and, if required the fabrication of pairs of bulk breakdown diodes with different triggering voltages. That is, the ion-implanted n-type region 16 need not be identical to the n-type region 12.

Referring to FIG. 1, the third bulk breakdown diode pair 3 is substantially the same as the first bulk breakdown diode 1 in structure and its orientation, while the second bulk breakdown diode pair 2 is reversed in orientation relative to the other two bulk breakdown diode pairs 1 and 2, and is of substantially the same construction.

In the component represented by FIG. 1, an electrical contact is required along the lower surface (as viewed in FIG. 1) common to the three pairs of bulk breakdown diodes 1, 2, and 3, and respective electrical contacts are required at the upper surfaces (as viewed in FIG. 1) of the pairs of bulk breakdown diodes 1, 2, and 3.

When the component represented by FIG. 1 is provided with electrical contacts, it may be represented by the devices shown in the circuit of FIG. 3, in which the pairs of bulk breakdown diodes 1, 2, and 3 have a common connection 6, and the respective pairs of bulk breakdown diodes have free terminals 7, 8, and 9. The free terminals 7, 8, and 9 of FIG. 3 are the separate electrical contacts for the respective pairs of bulk breakdown diodes of FIG. 1, and the common connection 6 is the common electrical contact for the three pairs of bulk breakdown diodes.

In the operation of the integrated circuit, as represented by FIGS. 1 and 3, a positive-going disturbance at the terminal 7, relative to the terminal 8, is limited to the sum of the triggering voltage of the forward biassed bulk breakdown diode of the bulk breakdown diode pair 1 and the triggering voltage of the forward biassed bulk breakdown diode of the bulk breakdown diode pair 2. A negative going voltage disturbance at the terminal 7 relative to the terminal 8 is limited to the sum of the triggering voltages of the other two bulk breakdown diodes of the bulk breakdown diode pairs 1 and 2. Disturbing voltages at the terminal 9, relative to the terminal 8, are limited, by the respective series combinations of the bulk breakdown diodes of the bulk breakdown diode pairs 2 and 3, in a manner similar to that described for disturbing voltages at the terminal 7.

Referring to FIG. 5, the semiconductor component includes three protectors 2000, 2100 and 2200 each of which is required to withstand only a proportion of the voltage which protectors connected in a delta configuration would need to withstand. Because of the use of the star configuration, the component is implemented by the use of vertical structures alone and has a higher current-handling capacity than known protection devices.

Referring to FIGS. 1 and 3, the first bulk breakdown diode pair 1, when used in the protection of the components of a telephone system, has its terminal 7 connected to the R or A line, its terminal 9 connected to the T or B terminal, and its terminal 8 connected to the ground line, of the telephone system. In the operation of the integrated circuit as represented by FIGS. 1 and 3, transient voltage changes which occur on both the R(or A) and T(or B) lines give rise to currents in both the bulk breakdown diode pairs 1 and 3, and the bulk breakdown diode 2 must sink both currents, so the second bulk breakdown diode 2 requires twice the current capacity of each of the other two bulk breakdown diodes 1 and 3. The relative current capacity requirements of the bulk breakdown diode pairs are met by making the areas of the active n+-type regions of the diodes of the second bulk breakdown diode pair 2 twice the corresponding areas of the diodes of the other two bulk breakdown diode pairs 1 and 3.

In the operation of the integrated circuit as represented by FIGS. 1 and 17, electrical charge generated in any one bulk breakdown diode pair is confined to that bulk breakdown diode pair by the isolating barrier 5 which surrounds each bulk breakdown diode pair.

Referring to FIG. 2 of the accompanying drawings, the second form of a semiconductor component, for limiting transient voltage changes, includes a first bulk breakdown diode-rectifier diode combination 200, a second bulk breakdown diode-rectifier diode combination 210, and a third bulk breakdown diode-rectifier diode combination 220.

Referring to FIG. 2, the first bulk breakdown diode-rectifier diode combination 200 includes a p-type region 201, an n−-type region 202 in contact with the p-type region 201, an n-type region 203 which lies within the n−-type region 202, a p-type region 204 which also lies within the n−-type region 202, is in contact with the n-type region 203, and has a common surface with the n−-type region 202, and an n+-type region 205 which lies within the p-type region 204 and has a common surface with the p-type region 204 and with the n−-type region 202. An n+-type ring 206 in the n−-type region 202 surrounds the region 204 and has a common surface with that region.

Referring to FIG. 2, the first bulk breakdown diode-rectifiers diode combination 200 includes an n+-type region to the rear of the p-type region 201 (as viewed in FIG. 2). The n+-type region to the rear of the p-type region 201 is not visible in FIG. 2, but is visible in FIG. 14, which represents a sectional view of the bulk breakdown diode-rectifier diode combination 200 taken along a line running from its front to its rear (as viewed in FIG. 2). The n+-type region 207, shown in FIG. 14, would be the n+-type region to the rear of the p-type region 201 in FIG. 2.

Referring to FIG. 2, the second bulk breakdown diode-rectifier diode combination 210 has substantially the same structure as the first bulk breakdown diode-rectifiers diode combination 200, but it is reversed relative to the first bulk breakdown diode-rectifier diode combination 200. As seen in FIG. 2, the second bulk breakdown diode-rectifier diode combination 210 includes an n+-type region 211, an n−-type region 212 in contact with the n+-type region 211, a p-type region 213 lying in the n−-type region 212 and having a common surface with that of the n−-type region 212, and an n+-type region 214 lying in the p-type region, to the rear of the p-type region 213 (as viewed in FIG. 2), and having a common surface with the p-type region 213. The n+-type region 211 corresponds to the n+-type region 207 of FIG. 14, and it will be understood that there are regions in the second bulk breakdown diode-rectifier diode combination 210 corresponding to the regions 201 and 203 of the first bulk breakdown diode-rectifier diode combination 200.

Referring to FIG. 2, the third bulk breakdown diode-rectifiers diode combination 220 is substantially the same as, and has the same relative orientation as, the first bulk breakdown diode-rectifier diode combination 200. The regions 221, 222, 223, 224, and 225 of the third bulk breakdown diode-rectifier diode combination 220 correspond to the regions 201. 202, 203, 204 and 205, respectively, of the first bulk breakdown diode-rectifiers diode combination 200.

Referring to FIG. 2, the n+-type ring 206 is a part of a ring system which extends around each of the bulk breakdown diode-rectifier diode combinations 200, 210, and 220. Contacts are required along the lower surface of the integrated circuit, and a contact is required on the upper surface of each bulk breakdown diode-rectifier diode combination 200, 210, and 220 (upper and lower referring to the integrated circuit as viewed in FIG. 2).

When the integrated circuit represented by FIG. 2 is provided with contacts, it may be represented by the circuit shown in FIG. 4, in which the bulk breakdown diode-rectifier diode combinations 200, 210, and 220 have a common connection 250 and terminals 251, 252, and 253.

Referring to FIG. 2, it is to be noted that the respective n−-type regions 202, 212, and 222 of the three bulk breakdown diode-rectifier diode combinations 200, 210, and 220 are provided by a common n−-type region. It is to be noted, also, that, at the front of the integrated circuit (as viewed in FIG. 2), the rectifier diode of the centre bulk breakdown diode-rectifier diode combination 210 lies between the bulk breakdown diodes of the outer bulk breakdown diode-rectifier diode combinations 200 and 220; at the rear of the integrated circuit (as viewed in FIG. 2), the rectifier diodes of the outer bulk breakdown diode-rectifiers diode combinations 200 and 220 flank the bulk breakdown diode of the centre bulk breakdown diode-rectifier diode combination 210. Thus the centre bulk breakdown diode-rectifiers diode combination 210 is of reversed orientation relative to the two outer bulk breakdown diode-rectifiers diode combinations 200 and 220, and that reversal in orientation is responsible for the relationships between the adjacent components of the integrated circuit changing from the front to the rear of the integrated circuit (as viewed in FIG. 2).

In the operation of the integrated circuit represented by FIGS. 2 and 4, a positive-going disturbance at the terminal 251, relative to the terminal 252, is limited to the sum of the forward breakdown voltage of the rectifier diode of the bulk breakdown diode-rectifier diode pair 200 and the triggering voltage of the bulk breakdown diode of the bulk breakdown diode-rectifier diode pair 210. A negative-going disturbance at the terminal 251, relative to the terminal 252, is limited to the sum of the triggering voltage of the bulk breakdown diode of the bulk breakdown diode-rectifier diode pair 200 and the forward breakdown voltage of the rectifier diode of the bulk breakdown diode-rectifier diode pair 210. Disturbing voltages at the terminal 253, relative to the terminal 252, are limited, by the components of the bulk breakdown diode-rectifier diode pairs 220 and 210, in a manner similar to that described for disturbing voltages at the terminal 251.

In the operation of the integrated circuit represented by FIGS. 2 and 4, the bulk breakdown diodes of the bulk breakdown diode-rectifier diode pairs 200 and 220 are triggered at substantially the same time if there is a common disturbing voltage at the terminals 251 and 253, and that common disturbing voltage exceeds either of the voltage limits set for those terminals. That result is achieved because the disturbance at the terminal 251, relative to the terminal 252, if it is negative and it exceeds the voltage allowed for a disturbance at that terminal, would cause the rectifier diode of the bulk breakdown diode-rectifier diode pair 210 and the bulk breakdown diode of the bulk breakdown diode-rectifier diode pair 200 to conduct. As the rectifier diode conducts it injects charge carriers into the n−-type region 212, which charge carriers travel from the n−-type region 212 into the n−-type region 222. The presence of charge carriers in the region 222 cause the triggering of the bulk breakdown diode of the third bulk breakdown diode-rectifier diode pair 220. The triggering of the first bulk breakdown diode-rectifier diode pair 200 and the third bulk breakdown diode-rectifier diode pair 220 would occur at substantially the same time, and, as a result, the disturbing voltages at the terminals 251 and 253 would be removed at substantially the same time. If, alternatively, a common positive disturbing voltage appears on the terminals 251 and 253, and the bulk breakdown diode of the bulk breakdown diode-rectifier diode pair 210 triggers, the voltages at the terminals 251 and 253 would be clamped by the conduction of the rectifier diodes of the bulk breakdown diode-rectifier diode pairs 200 and 220. The rectifier diodes would conduct at substantially the same time and would have substantially the same voltage drop.

Referring to FIG. 2, the substantially simultaneous triggering of more than one of the diode pairs, in the situations described above, result from three aspects of the structure of the component. The first aspect is that of so siting the bulk breakdown diodes as to allow charge carriers from each of those bulk breakdown diodes, when triggered, to reach at least one other bulk breakdown diode through their common n−-type region 202-212-222. In that respect, the bulk breakdown diode of the central bulk breakdown diode-rectifier diode combination 210 is able to supply charge carriers to, and to receive charge carriers from, each of the other bulk breakdown diode-rectifiers diode combinations 200 and 220, with the result that all the bulk breakdown diode-rectifier diode combinations will be triggered once the central bulk breakdown diode-rectifier diode combination 210 is triggered. The second aspect is that of making the p-type regions represented by the regions 201 and 211 in FIG. 2 common to the bulk breakdown diodes of the three diode pairs in order to achieve a current mirror effect, whereby the triggering of any one bulk breakdown diode will result in the triggering of the adjacent bulk breakdown diode. The third aspect is that of so siting the rectifier diodes as to allow charge carriers from them, when conductive, to flow to the adjacent bulk breakdown diode, which may not have triggered, and which would then be triggered by the supply of charge carriers from the rectifier diode.

It will be understood that all the diodes may be reversed without altering the operation of the circuit represented by FIG. 4.

Referring to FIG. 2, the second form of semiconductor component for limiting transient voltages occupies less area than the first form of the semiconductor component. The omission of the isolation diffusion of the first form of the component provides a first reduction in the area required by the component. There is preferential conduction by the "vertical" structures (that is, from the p-type region 201, say, to the n+-type region 205, say, of the first bulk breakdown diode-rectifiers diode pair 200) rather than by the "lateral" structures (that is, from the p-type region 213, say, to the n+-type region, say, between the first and second bulk breakdown diode-rectifier diode pairs 200 and 210). The area required for the rectifier diode is smaller than that required for a bulk breakdown diode because the rectifier diode exhibits a lower conduction voltage and is required to dissipate less power than its associated breakdown diode. The bulk breakdown diodes used for the second form of the component require a breakdown voltage about twice that required for the first form of the component (since, in the second form of the component there is a single bulk breakdown diode setting the voltage limit for the protected system whereas, in the first form of the component, there are two series-connected bulk breakdown diodes setting the limit voltage for the protected system). Up to triggering voltages of about 200 V, the area required for a bulk breakdown diode decreases with increasing surge current capacity; since the bulk breakdown diodes required for the first and second forms of the component come within the 200 V limit, each bulk breakdown diode of the second form of the component requires an area of no more than half the area of either the first or third bulk breakdown diode of the first form of the component.

Referring to FIG. 2, in the second form of the component, the n-type regions represented by the n-type regions 203 and 223 (there is a third n-type region in the second bulk breakdown diode but that is not visible in FIG. 2) are implanted at the same operation, which makes for close matching of the breakdown voltages of the three bulk breakdown diodes. Further, as all of the formations (the n+-type regions) which set the triggering voltages of the bulk breakdown diodes are on one side of the semiconductor body the results obtained are more consistent than is the case where there are voltage-setting formations on both sides of the semiconductor body.

Referring to FIG. 2, the thickness of the n+ region 212 can be controlled adjacent to the n+region 211 by varying the depth of the n+ region 211 and, in particular, the n+ region of the bulk breakdown diode of the bulk breakdown diode/rectifier diode pair 210 can be thicker than the n+ region 212 of the rectifier diode of that pair. An arrangement with a thinner n+ region 212 provides a rectifer diode with a lower overshoot, on forward conduction, than an arrangement in which the n+ region 212 has substantially the same thickness as the regions 202 and 222, say. Thickness is measured in the direction of current flow through the semiconductor component, that is, from the n+ region 210 to the p region 213. Alternatives for reducing the thickness of the n+ region 212 are (i) increasing the depth of the n+ region 211, (ii) increasing the depth of the p region 213, or (iii) increasing the depths of both the region 211 and the region 213.

Referring to FIG. 6, a unidirectional bulk breakdown diode may be represented, as shown, by a simplified structure which includes a p-type layer 50, an n⁻-type layer 51, an n-type layer 52, a p-type layer 53, and an n+-type layer 54.

Referring to FIG. 7, the simplified structure of FIG. 6 may be redrawn, as shown, by separating the layers 51, 52 and 53, into the regions 501-502-503, 521-522-523, and 531-532-533, respectively.

FIG. 8 is an equivalent circuit of FIG. 6 or FIG. 7. Referring to FIG. 8, a gradually increasing voltage applied between the emitter electrodes of the transistors is passed on through the emitter-base diode of the PNP transistor 55 and will eventually become large enough to cause the zener diode 58 to conduct current; that current causes the injection of charge into the base electrode of the NPN transistor 56, making the NPN transistor 56 conductive. Once the NPN transistor 56 becomes conductive, regenerative switching takes place with the PNP transistor 55. Switch-off takes place once the available current falls below the holding current for the device, when current shunted by the resistors 59 and 60 robs the NPN transistor 56 of base drive and it switches off degeneratively with the PNP transistor 55.

Referring to FIG. 8, a rapidly increasing voltage applied between the emitters of the transistors is conducted to the base electrode of the NPN transistor 56 and makes that transistor conductive. Conduction, for a time, occurs because the NPN transistor 56 and the zener diode 58 form an "amplified zener", but the PNP transistor 55, under the influence of the high drive current taken by the NPN transistor 56, is forced to turn on and aids regenerative turn-on. The device responds in the manner described because the PNP transistor 55 is designed for a high reverse emitter-base breakdown voltage (so that the device has the capability of blocking a high reverse voltage) and is, consequently, slow in operation.

FIG. 10 is a simplified structural representation of a combined bulk breakdown diode and rectifier diode, connected as shown in FIG. 11, consisting of an n+-type layer 70, a p-type layer 71, an n⁻-type layer 72, an n-type layer 73, a p-type layer 74, and an n+-type layer 75.

FIG. 12 represents the operating characteristic of the combination of a bulk breakdown diode 81 and a rectifier diode 80, as shown in FIG. 11.

Referring to FIG. 12, the path OA represents the initial breakdown of the bulk breakdown diode, the path AB represents the change to the low-impedance state, and the path BC represents conduction in the low-impedance state. The path OD represents forward conduction of the rectifier diode.

Figure 18:
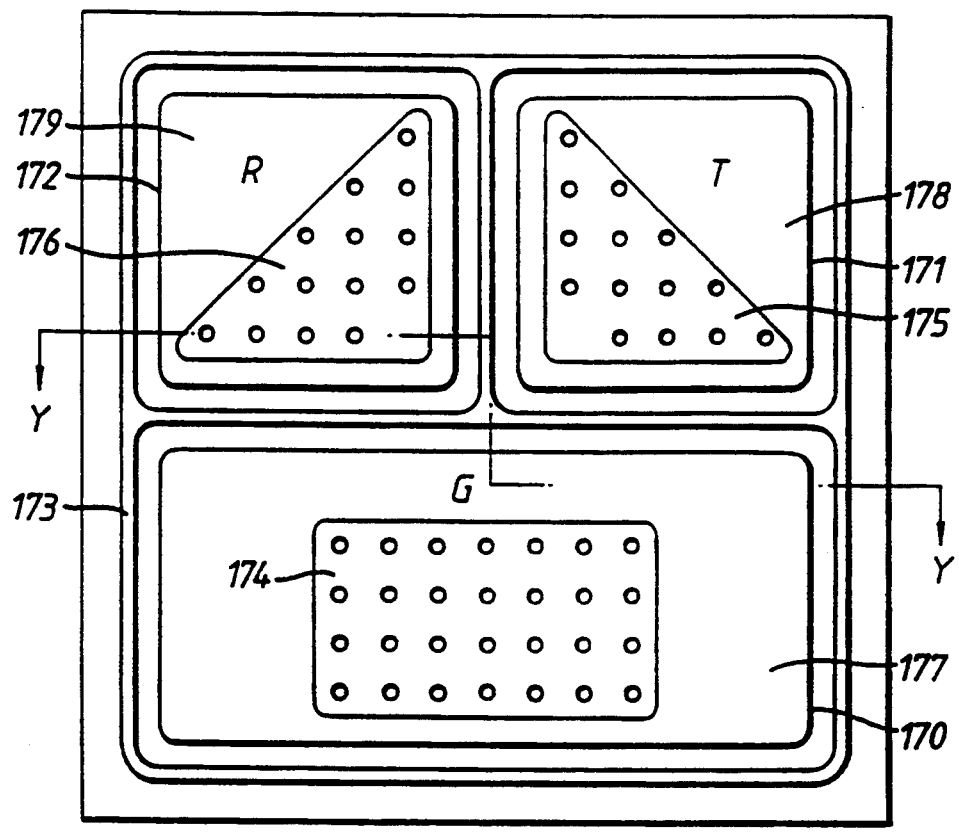
FIG. 18 represents, in plan, an alternative integrated circuit arrangement of the third form of semiconductor component suitable for limiting transient voltage charges, which is an alternative integrated circuit arrangement for the component represented by FIG. 4.

Referring to FIG. 18, the integrated circuit includes respective first, second, and third bulk breakdown diode-rectifier diode pairs 170, 171, and 172. The integrated circuit is shown in FIG. 18 without the contact layers on the respective upper surfaces of the bulk breakdown diode-rectifier diode pairs 170, 171, and 172, so that the n+-type regions 174, 175, and 176 are visible.

The integrated circuit includes three separate p-type regions 177, 178, and 179 and an n+-type formation 173 which runs along the outer periphery of the integrated circuit and between the p-type regions 177, 178, and 179.

Figure 14:
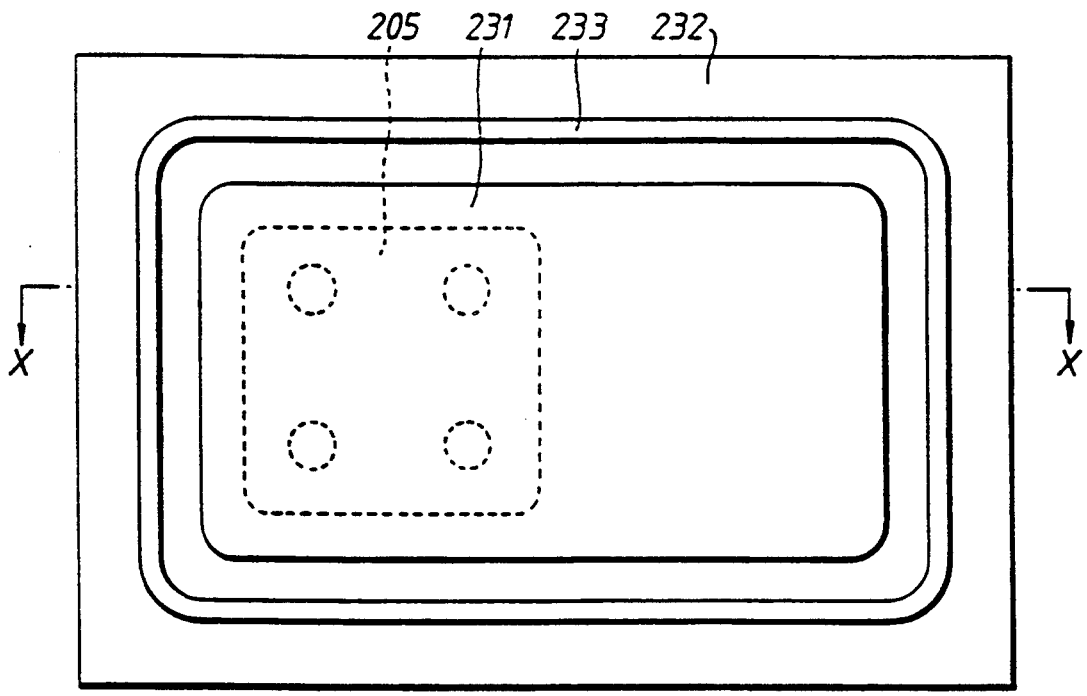
Figure 15:
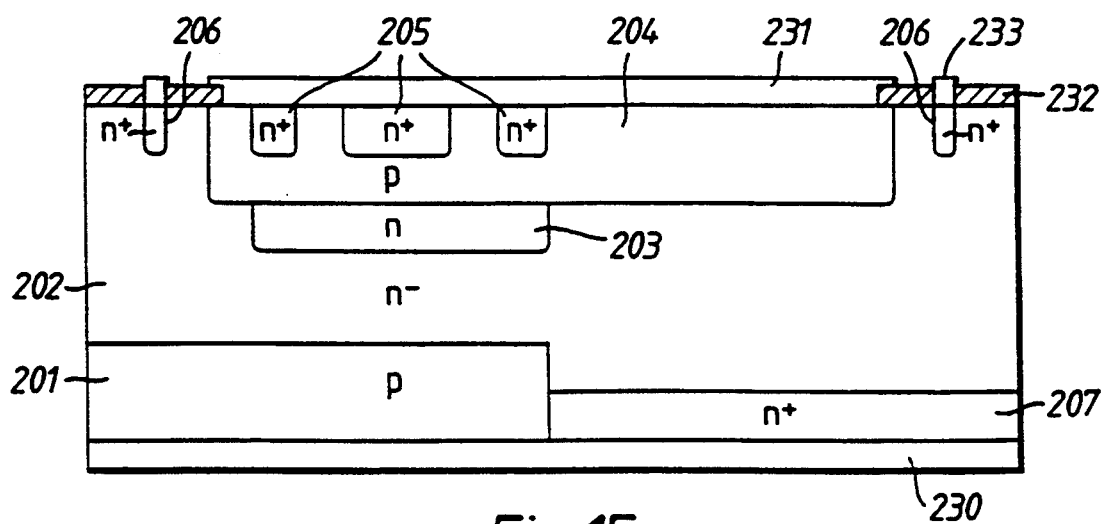
Figure 16:
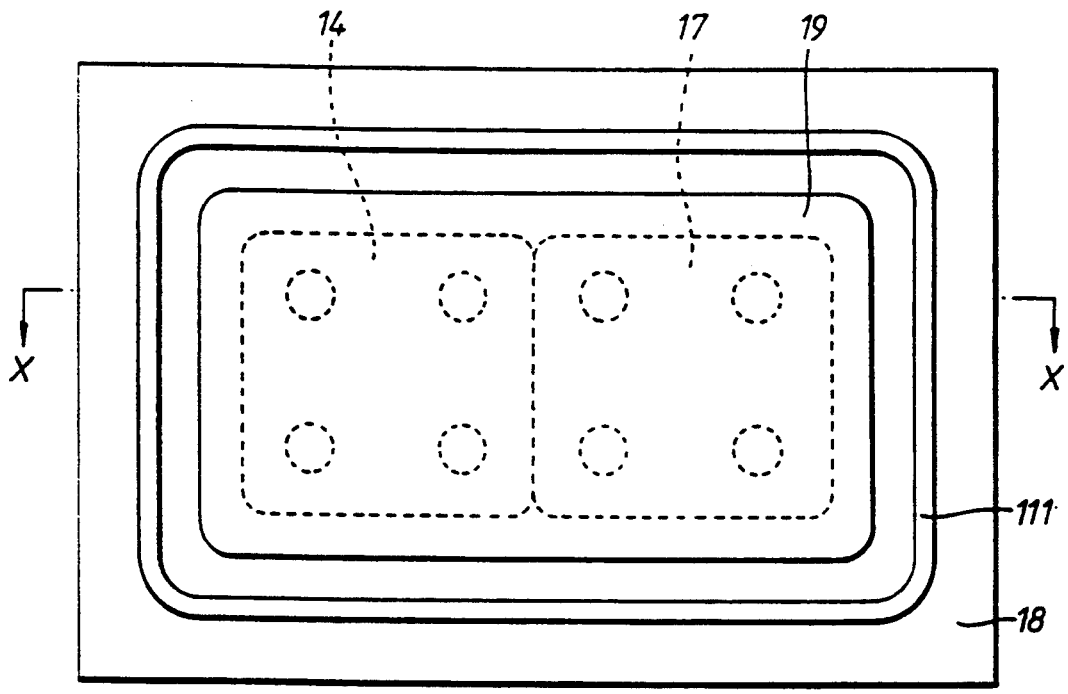
Figure 19:
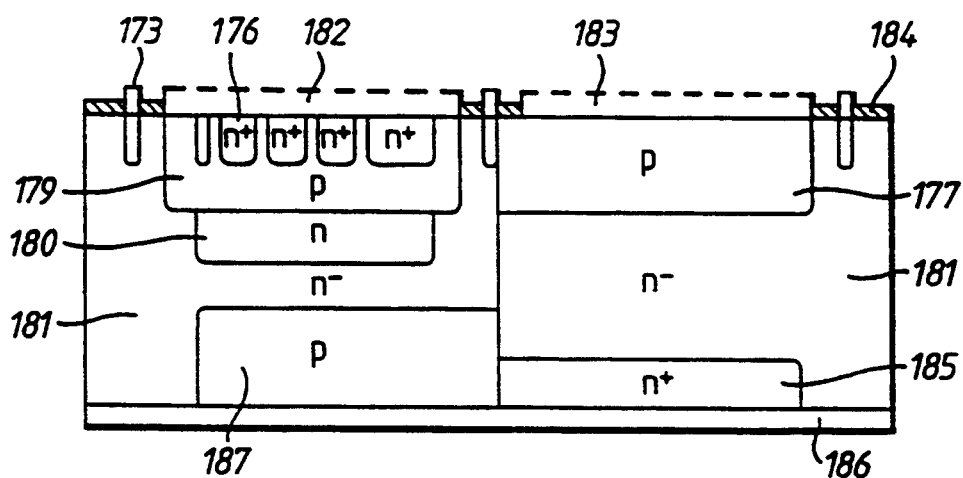
FIG. 19 represents a sectional view through the integrated circuit represented by FIG. 18 taken along the line Y—Y.

Referring to FIG. 19, the structure of each of the bulk breakdown diode-rectifier diode pairs 170, 171, and 172 is substantially the same as is shown in FIG. 15; in FIG. 18, the p-type region 177, the n⁻-type region 181, and the n+-type region 185 correspond to the respective regions 204, 202, and 207 of FIG. 14, and, in FIG. 19, the n+-type region 176, the p-type region 179, the n-type region 180, the n⁻-type region 181, and the p-type region 187 correspond to the respective regions 205, 204, 203, 202, and 201 of FIG. 14. The regions 177, 181, and 185 shown in FIG. 19 belong to the first bulk breakdown diode-rectifier diode pair 170, and the regions 176, 179, 180, 181, and 187 of FIG. 19 belong to the third bulk breakdown diode-rectifier diode pair 172.

Figure 1:
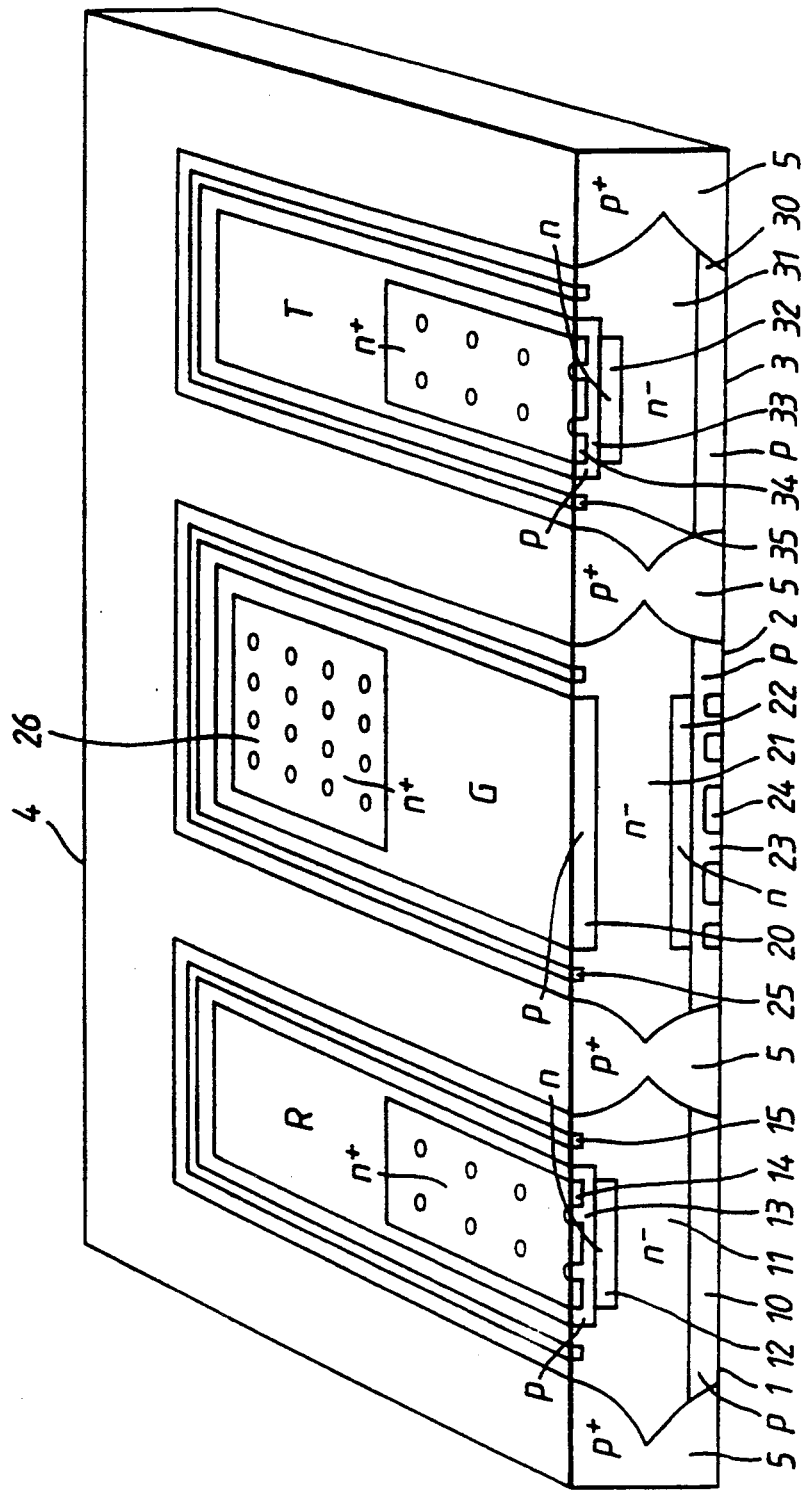
Figure 2:
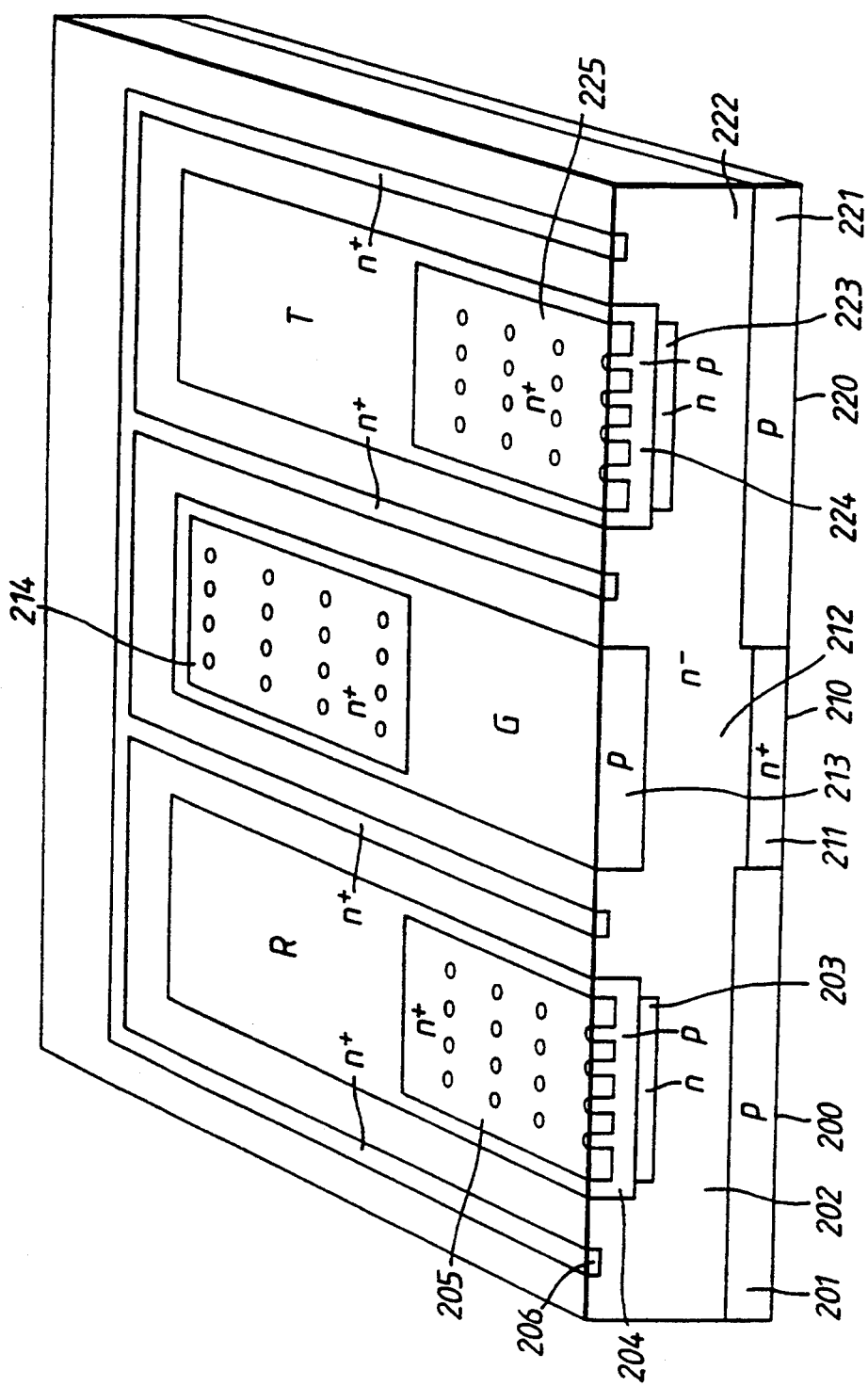

Referring to FIG. 18, the relative orientations of the bulk breakdown diode-rectifier diode pairs 170, 171 and 172 are such as to increase the tendency of one bulk breakdown diode, when triggered, to trigger the other bulk breakdown diodes. The first bulk breakdown diode-rectifiers diode 170 has a substantially rectangular shape in the plane of the figure, while each of the second and third bulk breakdown diode-rectifier diode pairs 171 and 172 has a substantially square shape in the plane of the figure. The second and third bulk breakdown diode-rectifiers diode pairs 171 and 172 are positioned side by side and alongside one longer side of the first bulk breakdown diode-rectifier diode combination 170. The bulk breakdown diodes of the bulk-breakdown diode rectifier pairs are grouped about the middle of the integrated circuit, providing a structure in which electrical charge generated in any one of the three bulk breakdown diode-rectifier diode pairs, through its being triggered, flows quickly to the adjacent bulk breakdown diodes, causing them both to be triggered. As is shown in FIG. 19, the n⁻-type region 181 is common to all the bulk breakdown diode-rectifier diode pairs 170, 171, and 172, and charge generated in that region in any one of the bulk-breakdown diode-rectifier diode pairs has a relatively short distance to travel in order to enter each of the other bulk breakdown diode-rectifier diode pairs. Therefore, the component represented by FIGS. 18 and 19 operates in substantially the way described for the component represented by FIG. 2, but the close grouping of the bulk breakdown diode-rectifier diode pairs provides a component with more rapid mutual triggering than the component represented by FIG. 2.

Figure 4:
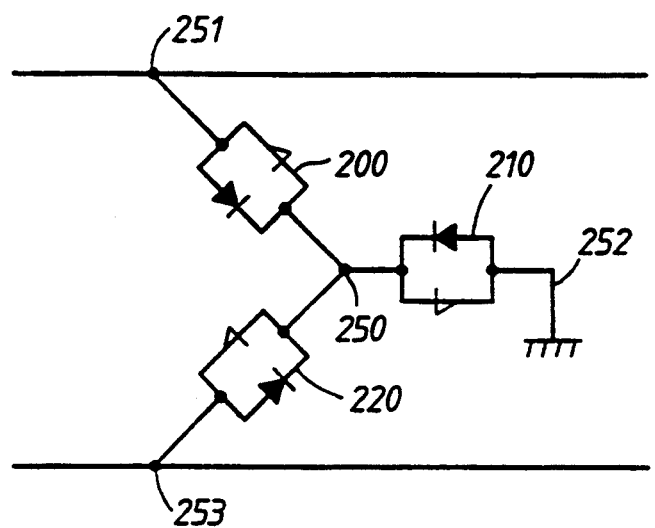
Figure 5:
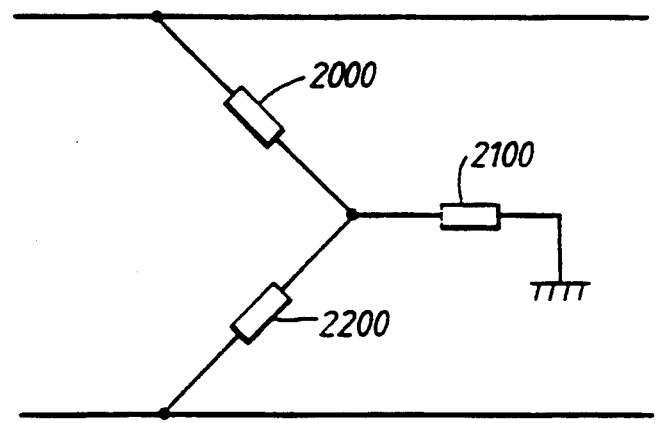
Figure 6:
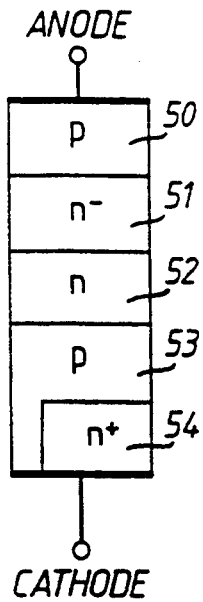
Figure 7:
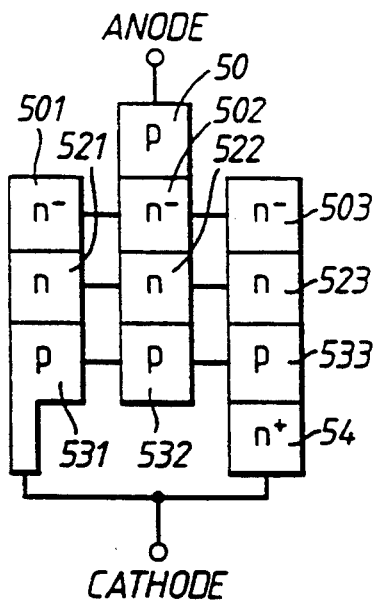
Figure 8:
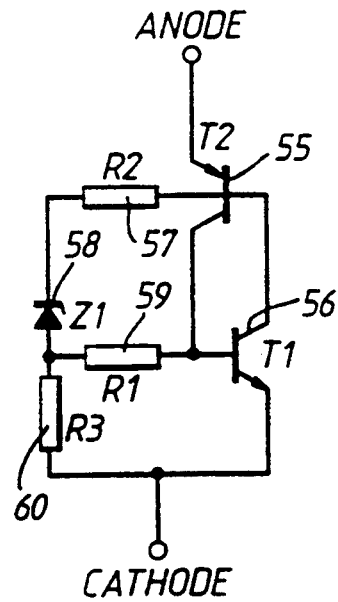
Figure 9:
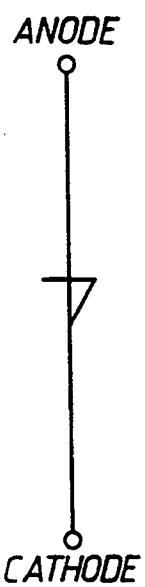
Figure 10:
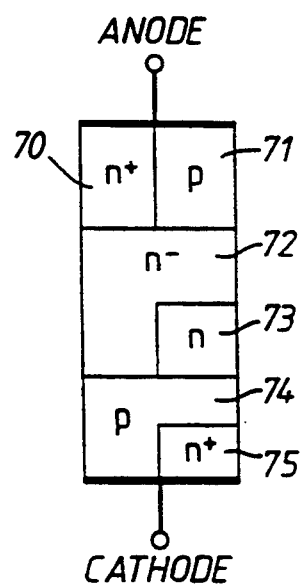
Figure 11:
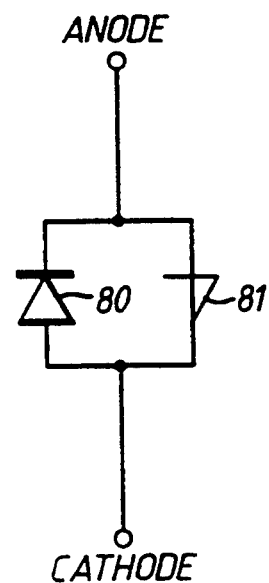
Figure 12:
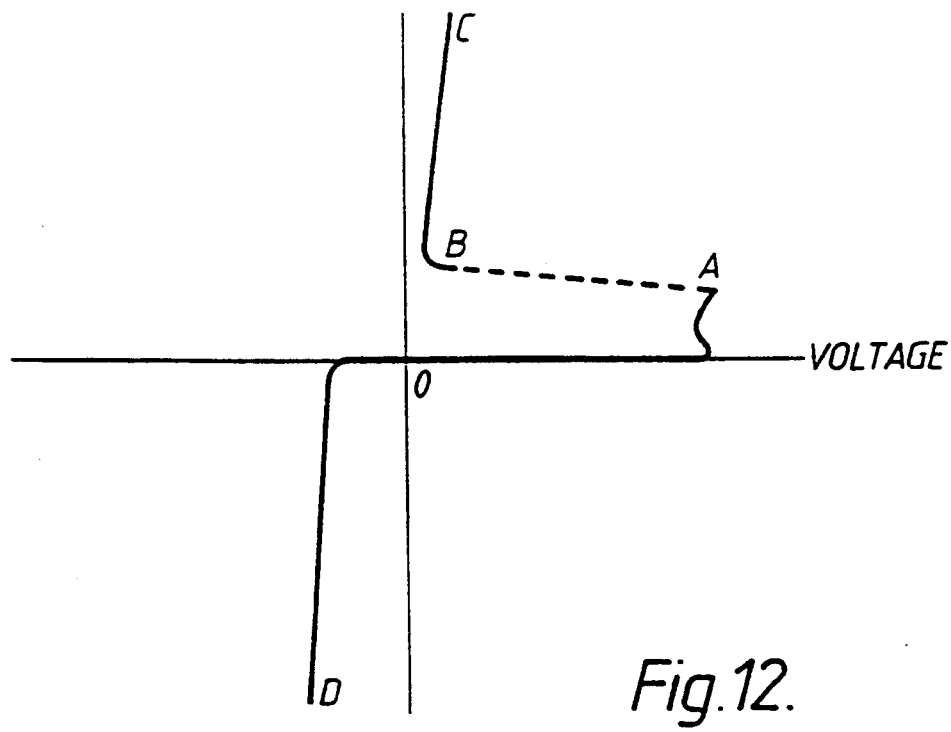
Figure 13:
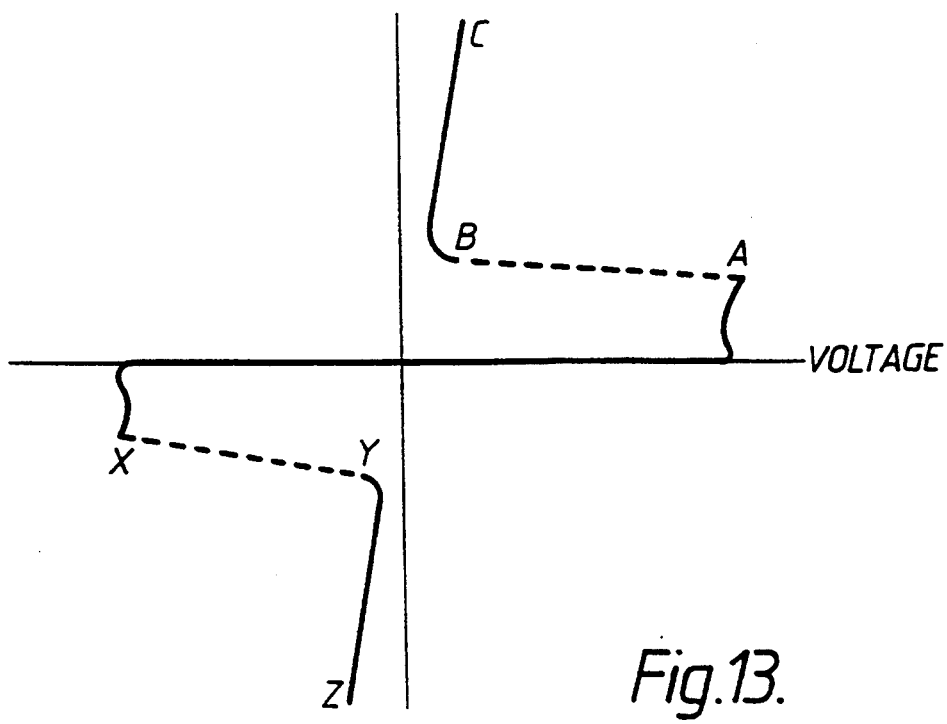
FIG. 13 represents the operating characteristics of a pair of bulk breakdown diodes (which need not be identical).

Referring to FIGS. 18 and 19, two of the bulk breakdown diodes, the cathode regions 175 and 176 of which would be connected respectively to the terminals 251 and 253 of FIG.4, are side by side and alongside the rectifier diode which is in shunt with the third bulk breakdown diode (the third bulk breakdown diode would have its cathode region 174 connected to the terminal 252 of FIG. 4). Therefore, the bulk breakdown diodes which would be connected to the A or Ring (terminal 251) and B or Tip (terminal 253) lines of a telephone system are close to the rectifier diode which would be connected to the ground line of the telephone system. In addition, those parts of the cathode regions 175 and 176 which are closest to the adjacent rectifier diode and to one another have no gaps filled by the adjacent p-type gate region 179, which provides bulk breakdown diodes which are more sensitive at those regions than elsewhere. Alternatively, enhanced sensitivity at those regions may be obtained by having fewer gaps in those regions, or smaller gaps in those regions.

The mutual triggering of the bulk breakdown diodes of the component represented by FIGS. 18 and 19 may be further improved by providing such n-type regions as that represented by the region 180 in FIG. 19 in a central region only of the component, in order to concentrate the current in the central region of the component. The improvement in mutual triggering may be accompanied by a reduction in the triggering current of the component and increased voltage overshoot for rapidly increasing currents. The tendency of the modified component to allow a voltage overshoot, under the specified conditions, may be reduced by the provision of a second n-type region which extends over the entire active area of the component. Each bulk breakdown diode with two n-type regions would be equivalent to two bulk breakdown diodes, one of the two bulk breakdown diodes being smaller than the other and having a higher sensitivity and a lower triggering voltage than the other bulk breakdown diode. The bulk breakdown diode with two n-type regions operates as first and second bulk breakdown diodes in which the first, smaller bulk breakdown diode, will trigger first and be the sole current conductor until its rate of current rise reaches some set value; that set value of current corresponds to a voltage overshoot which activates the second, larger bulk breakdown diode.

Figure 17:
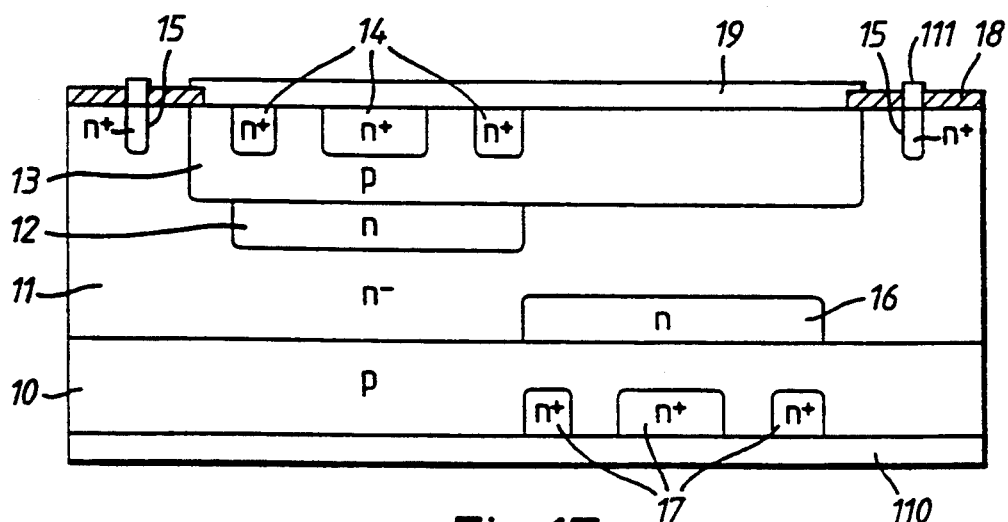

Referring to FIG. 17, the n-type region 12 which is provided at the junction between the n⁻-type region 11 and the p-type region 13 is characteristic of a bulk breakdown diode which is a PNPN device. As will be evident from FIG. 17, the region 11 and the region 12 are of the same conductivity type, and the region 12 is more heavily doped than the region 11. The component represented by FIG. 17, being a pair of bulk breakdown diodes, includes a first n-type region 12 for one of the bulk breakdown diodes and a second n-type region 16 for the other bulk breakdown diode.

Referring to FIGS. 17 and 19, the region 180 of FIG. 19 corresponds to either the region 12 or the region 16 of FIG. 19.

Referring to FIGS. 1, 2, 15, 17 and 19, it is evident that the bulk breakdown diode is a PNPN diode, that is, a multi-junction diode.

Figure 3:
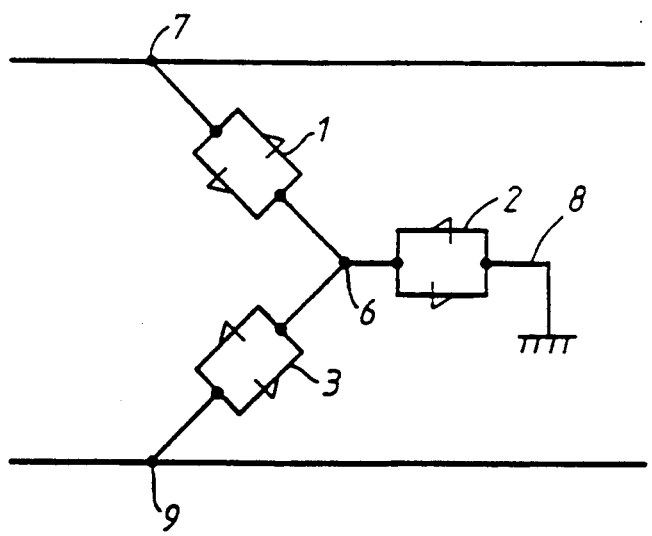

The components represented by FIGS. 3 and 4 will be recognised as star-connected components. In the case of the component represented by FIG. 3, one of the pair of bulk breakdown diodes forming the arm of the star connected to the ground line of a system to which the component is connected, triggers when a bulk breakdown in either of the other arms of the star is triggered. A result of the star arrangement is that the centre of the star goes to ground potential when there is a transient voltage change causing triggering of the component. That result is not obtainable from a delta-connected component and, for respective delta-connected and star-connected components with identical bulk breakdown diodes, the star-connected component will permit half the transient voltage change between the supply lines that the delta-connected component will permit.

The components described above are single chip over-voltage protectors having three or more terminals. All the structures described may be fabricated in a single chip with three or more terminals. The structures all operate with vertical currents and have higher current capacities than previously known structures which operate with lateral currents. The components respond to common disturbing voltages on the supply lines to which they are connected by reducing the impulse voltage developed between the supply lines. The components may include bulk breakdown diodes having differing triggering voltages adjusted by different levels of implantation for the n-type regions. Combinations of bulk breakdown diode-rectifier diode and bulk breakdown diode pairs may be used in the components. Two forms of the component provide coupling between the bulk breakdown diodes.

We claim:

1. A semiconductor component suitable for limiting transient voltages on the supply lines of a system having at least three supply lines comprising at least three input means for connection to respective ones of the supply lines, and for each input means, a respective multi-junction diode which has a threshold voltage at which it changes from a high-impedance state to a low-impedance state, each multi-junction diode being connected in the same sense between a respective input means and a common terminal, each multi-junction diode being paired with a respective further diode connected in shunt with it and in the opposite sense to it and one pair of the diodes having current capacities substantially equal to the combined current capacities of the other pairs of diodes.

2. A semiconductor component as claimed in claim 1 wherein at least one, but not all, of the further diodes is a multi-junction diode and each of the other further diodes has a single PN junction.

3. A semiconductor component as claimed in claim 1 wherein each of the further diodes is a multi-junction diode.

4. A semiconductor component as claimed in claim 1 which is in the form of a semiconductor body having two substantially parallel major surfaces wherein the electrodes of the diodes lie on the major surfaces, the input means are a plurality of electrical conductors which make contact on one of the major surfaces with the electrodes of respective pairs of diodes, a further electrical conductor which is the common terminal makes contact on the other of the major surfaces with all of the electrodes at that surface, and the other pairs of diodes are symmetrically positioned in relation to the pair of diodes having current capacities substantially equal to the combined current capacities of the other pairs of diodes.

5. A semiconductor component as claimed in claim 4 wherein the diodes are alternately a multi-junction diode and a further diode both along and across the major surface.

6. A semiconductor component as claimed in claim 4 wherein each of the further diodes is a multi-junction diode and an isolation region isolates each multi-junction diode pair electrically from the outer multi-junction diode pairs occupying the semiconductor body.

7. A semiconductor component as claimed in claim 4 wherein each of the further diodes has a single PN junction and a doped region of the semiconductor body is common to all the diode pairs.

8. A semiconductor component as claimed in claim 1 wherein each multi-junction diode has a substantially PNPN structure and has an inner N region which is a lightly doped n-type ($n^-$) region which is thicker than a lightly doped n-type ($n^-$) region of each further diode, where the thickness of each region is measured in the direction of current flow through the component.

9. A semiconductor component as claimed in claim 1 wherein each multi-junction diode has a substantially PNPN structure and includes in the inner N region which is a lightly doped n-type ($n^-$) region a buried n-type region of greater impurity concentration than the $n^-$-region wherein the buried n-type region is adjacent to the inner P region of the PNPN structure.

10. A semiconductor component as claimed in claim 1 in the form of a semiconductor body which is so structured that when one of a first pair of diodes conducts, its electrical charge is free to flow to and initiate conduction of at least one of another pair of diodes.

11. A semiconductor component as claimed in claim 7 wherein the multi-junction diodes are grouped around the middle of the semiconductor body.

12. A semiconductor component as claimed in claim 11 wherein the multi-junction diodes are so structured as to conduct charge more readily near the middle of the semiconductor body than elsewhere in the semiconductor body.

13. A semiconductor component as claimed in claim 12 wherein each multi-junction diode is so structured as to operate as a first multi-junction diode near the middle of the semiconductor body and as a second multi-junction diode elsewhere in the semiconductor body, the first multi-junction diode being smaller and more sensitive than the second multi-junction diode.

14. A telephone circuit including a semiconductor component as claimed in claim 1.

* * * * *